(12) United States Patent
Subramanian et al.

(10) Patent No.: US 11,563,000 B2
(45) Date of Patent: Jan. 24, 2023

(54) GATE ENDCAP ARCHITECTURES HAVING RELATIVELY SHORT VERTICAL STACK

(71) Applicant: Intel Corporation, Santa Clara, CA (US)

(72) Inventors: Sairam Subramanian, Portland, OR (US); Walid M. Hafez, Portland, OR (US); Hsu-Yu Chang, Hillsboro, OR (US); Chia-Hong Jan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 51 days.

(21) Appl. No.: 16/830,120

(22) Filed: Mar. 25, 2020

(65) Prior Publication Data
US 2021/0305243 A1  Sep. 30, 2021

(51) Int. Cl.
*H01L 27/088* (2006.01)
*H01L 29/78* (2006.01)
*H01L 29/66* (2006.01)
*H01L 21/8234* (2006.01)

(52) U.S. Cl.
CPC .. *H01L 27/0886* (2013.01); *H01L 21/823431* (2013.01); *H01L 21/823468* (2013.01); *H01L 21/823475* (2013.01); *H01L 21/823481* (2013.01); *H01L 29/66795* (2013.01); *H01L 29/785* (2013.01)

(58) Field of Classification Search
CPC ....... H01L 21/823481; H01L 29/66795; H01L 29/785; H01L 21/823431; H01L 27/0886
See application file for complete search history.

(56) References Cited

U.S. PATENT DOCUMENTS

| | | | |
|---|---|---|---|
| 2016/0133632 A1* | 5/2016 | Park | H01L 21/02164 257/369 |
| 2019/0363026 A1* | 11/2019 | Lee | H01L 21/823885 |
| 2020/0006354 A1* | 1/2020 | Wen | H01L 27/0207 |
| 2020/0044070 A1* | 2/2020 | Wang | H01L 29/785 |
| 2021/0028067 A1* | 1/2021 | Jaeger | H01L 21/76814 |

FOREIGN PATENT DOCUMENTS

| | | | | |
|---|---|---|---|---|
| WO | WO-2018004680 A1 * | 1/2018 | ....... | H01L 21/76895 |
| WO | WO-2018063365 A1 * | 4/2018 | ....... | H01L 21/76895 |

* cited by examiner

*Primary Examiner* — Tuan A Hoang
(74) *Attorney, Agent, or Firm* — Schwabe, Williamson & Wyatt, P.C.

(57) ABSTRACT

Gate endcap architectures having relatively short vertical stack, and methods of fabricating gate endcap architectures having relatively short vertical stack, are described. In an example, an integrated circuit structure includes a first semiconductor fin along a first direction. A second semiconductor fin is along the first direction. A trench isolation material is between the first semiconductor fin and the second semiconductor fin. The trench isolation material has an uppermost surface below a top of the first and second semiconductor fins. A gate endcap isolation structure is between the first semiconductor fin and the second semiconductor fin and is along the first direction. The gate endcap isolation structure is on the uppermost surface of the trench isolation material.

15 Claims, 13 Drawing Sheets

GATE ENDCAP ARCHITECTURES HAVING RELATIVELY SHORT VERTICAL STACK

TECHNICAL FIELD

Embodiments of the disclosure are in the field of semiconductor devices and processing and, in particular, gate endcap architectures having relatively short vertical stack, and methods of fabricating gate endcap architectures having relatively short vertical stack.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process.

Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

DESCRIPTION OF THE EMBODIMENTS

Figure 1:
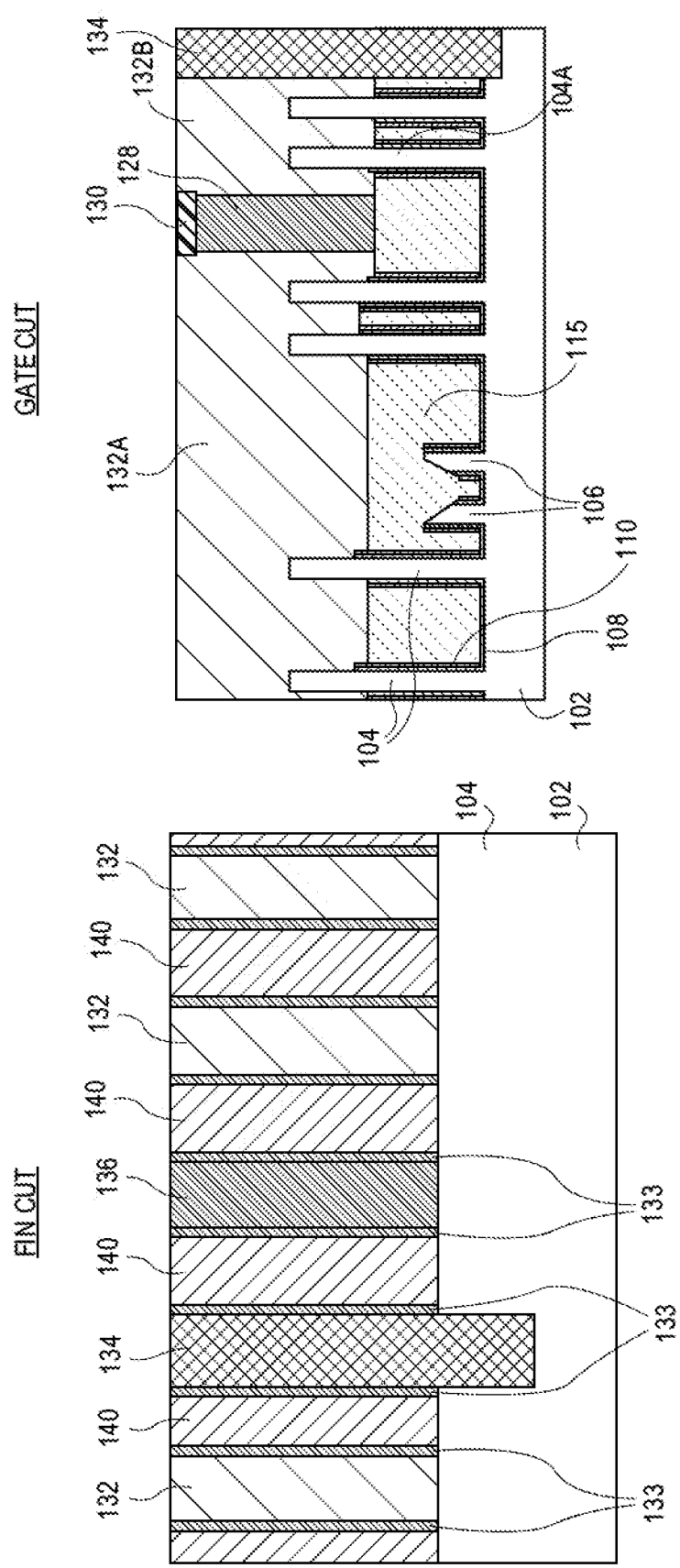
FIG. 1 illustrates a fin cut cross-sectional view and a gate cut cross-sectional view of an integrated circuit structure having a gate endcap isolation structure, in accordance with an embodiment of the present disclosure.

Gate endcap architectures having relatively short vertical stack, and methods of fabricating gate endcap architectures having relatively short vertical stack, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments of the present disclosure are directed to semiconductor structures or devices having one or more gate endcap isolation structures. In one or more embodiments, simultaneous patterning of realigned gate and contact endcaps with short vertical stack is used to fabricate integrated circuit structures. Embodiments described herein may address issues associated with scaling diffusion end-to-end spacing in an ultra-scaled process technology.

To provide context, logic devices are aggressively scales in dimension, creating fabrication and yield challenges for gate and contact end cap patterning. Most patterning solutions place an enormous burden on lithography/etch to create small plugs with high aspect ratios. Embodiments described herein may be implemented to address the problem of scaling gate and contact end-to-end spacing in an ultra-scaled process technology while mitigating the overlap capacitance impact and defectivity from metal in plug defects.

Today's state of the art process rely on a self-aligned gate end architecture that provides a potential landing spot for a gate or contact plug. The plug patterning relies on etching holes into a sacrificial hardmask or other etch-able films and filling the resultant hole with an insulating material. The bulk sacrificial film is then removed before metal fill. Current schemes for plug patterning and fill are susceptible to metal in plug defects that would provide a leakage path and short the two nodes across a plug. With aggressive scaling of gate dimensions in the state of the art technologies, etching holes in a high aspect ratio and subsequent fill with insulators are challenging and result in voids or process defects: any un-etched polymer or sliver in the plug can fill with metal creating metal in plug defects that short the two segments that are supposed to insulated by the plug. A self-aligned gate end architecture also increases the overlap capacitance of the devices due to the increase in vertical dimensions and places a severe constraint on gate/contact metal deposition/fill. It also introduces another critical vertical dimension (self-aligned gate end wall height) that can decrease process margin.

In accordance with one or more embodiments of the present disclosure, a perpendicular grid of an insulating material is patterned to run perpendicular to gate/contact lines. The patterning is performed prior to gate/contact definition and encompasses the sum of all desired gate and contact plugs. For example, plugs can be printed one gate pitch wider. The intersection of the grid with gate/contact lines provides the locations of end cap plugs. Inverted patterning schemes can then be used to trim/recess the "extra" plugs at plug ends that were printed to avoid sliver risk from lithography registration. Embodiments described herein may be implemented to address patterning limitations of the current art, such as: (1) tall gate height resulting in unfavorable aspect ratios for etches and fills and resultant increased capacitance, and/or (2) metal in plug defects/plug void defects that short two nodes through the endcap.

For comparison purposes, a state-of the art self-aligned gate endcap architecture patterning process involves deposition of a sacrificial hardmask subsequent to gate and contact patterning. Patterning is performed to open holes which land on a spacer aligned wall (SAW) that can act as a plug. Insulating material is filled to form the plug and polished. Remove remaining sacrificial material and fill with contact or gate material is then performed. By contrast, in accordance with embodiments described herein, plugs are patterned as a grid of trench contact and gate plugs that runs perpendicular to gate/contact lines and is as tall as the final desired gate height. The grid is formed prior to gate and contact patterning. Plugs can be upsized on pitch. Targeted lithography can be used to trim the endcap for contact plugs post gate etch and the gate plugs pre gate metallization. A polish process may be performed to the plug grid height after gate and contact metallization (e.g., at the end of the front end of the process).

As an exemplary structure fabricated according to approaches described herein, FIG. 1 illustrates a fin cut cross-sectional view and a gate cut cross-sectional view of an integrated circuit structure having a gate endcap isolation structure, in accordance with an embodiment of the present disclosure.

Referring to FIG. 1, a semiconductor fin 104 is on a substrate 102. In one embodiment, the semiconductor fin 104 is a silicon fin continuous with an underlying silicon substrate 102.

Referring to the fin cut perspective of FIG. 1, one or more gate stacks 132 is over the semiconductor fin 104. Gate spacers 133 are along the sides of the gate stacks 132. An inter-layer dielectric layer 140 is between gate spacers 133 of adjacent gate stacks 132. As is depicted, one or more of the gate stacks 132 is replaced with a through fin isolation structure 134, such as a structure formed during a replacement gate poly cut process in which some of the underlying fin is etched. As is also depicted, one or more of the gate stacks 132 is replaced with a gate plug structure 136, such as a structure formed during a replacement gate poly cut process in which the underlying fin is not etched. In an embodiment, a gate stack as described herein includes a gate electrode on a gate dielectric, and may further include a gate insulating cap.

Referring to the gate cut perspective of FIG. 1, several fins 104 (including 104A) are shown, including stub portions 106 where select fins 104 were removed. A trench isolation material 115 separates fins 104. Lower portions of fins may include an isolation layer 108 and/or lower fin spacers 110. One of the gate stacks 132 is over the fins 104 but is separated into a first portion 132A and a second portion 132B by a gate endcap isolation structure 128. Gate end cap isolation structure 128 may have a dielectric cap 130 thereon, as is depicted, e.g., to provide protection for the gate endcap isolation structure 128 during etch processing.

With reference again to the gate cut perspective of FIG. 1, in accordance with an embodiment of the present disclosure, an integrated circuit structure includes a semiconductor fin 104A along a first direction (into and out of the page of the gate cut perspective). A trench isolation material 115 is adjacent the semiconductor fin 104A. The trench isolation material 115 has an uppermost surface below a top of the semiconductor fin 104A. A gate endcap isolation structure 128 (and possibly including cap 130) is along the first direction (into and out of the page of the gate cut perspective). The gate endcap isolation structure 128 is on the uppermost surface of the trench isolation material 115. A gate structure 132B is along a second direction orthogonal to the first direction (left to right of the gate cut perspective). The gate structure 132B is over the semiconductor fin 104A and is in contact with a side of the gate endcap isolation structure 128. The integrated circuit structure further includes a through fin isolation structure 134. An end of the gate structure 132B is in contact with the through fin isolation structure 134, the end opposite the gate endcap isolation structure 128 along the second direction. In an embodiment, although not depicted in the gate cut perspective, a sidewall spacer 133 is along sides of the gate structure 132B. The gate endcap isolation structure 128 is not within the sidewall spacer, but the through fin isolation structure 134 is within the sidewall spacer 133 (e.g., as depicted in the fin cut perspective). In an embodiment, the gate endcap isolation structure 128 extends beyond the gate structure along the first direction, exemplary structures of which are described below.

FIGS. 2A-2H illustrate cross-sectional views and plan views representing various operations in a method of fabricating an integrated circuit structure having a gate endcap isolation structure, in accordance with an embodiment of the present disclosure.

Figure 2A:
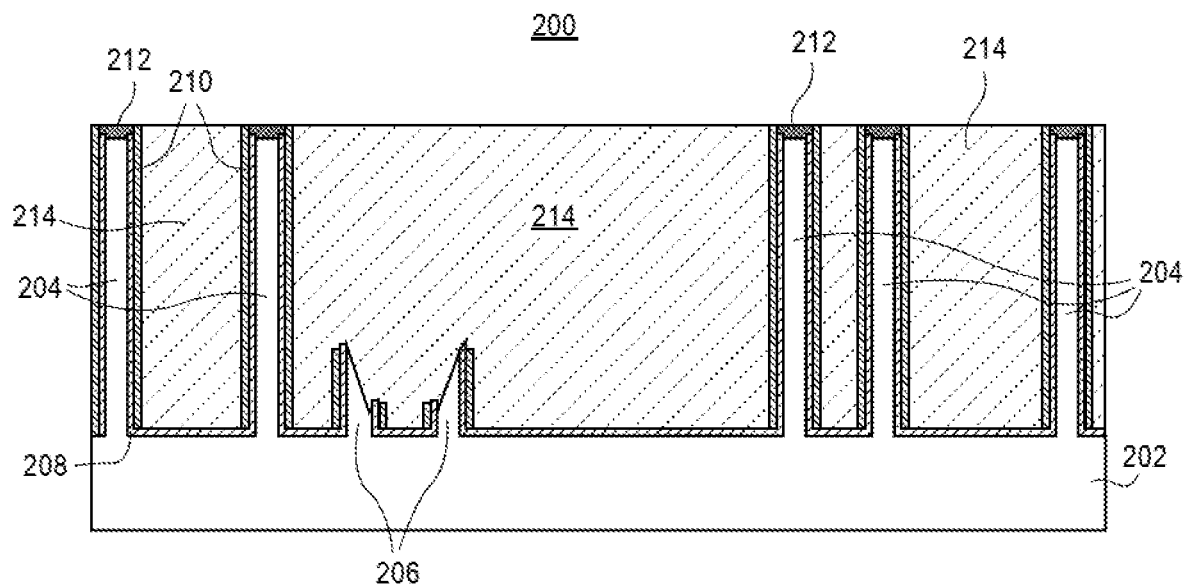
FIGS. 2A-2H illustrate cross-sectional views and plan views representing various operations in a method of fabricating an integrated circuit structure having a gate endcap isolation structure, in accordance with an embodiment of the present disclosure.

Referring to FIG. 2A, a starting structure 200 includes several semiconductor fins 204, including stub portions 206 where select fins 204 were removed. In one embodiment, the semiconductor fins 204 are silicon fins continuous with an underlying silicon substrate 202. An isolation material 214 separates fins 204. An isolation layer 208 and/or fin spacers 210 and/or a fin cap 212 is included on the fins 204, as is depicted.

Figure 2B:
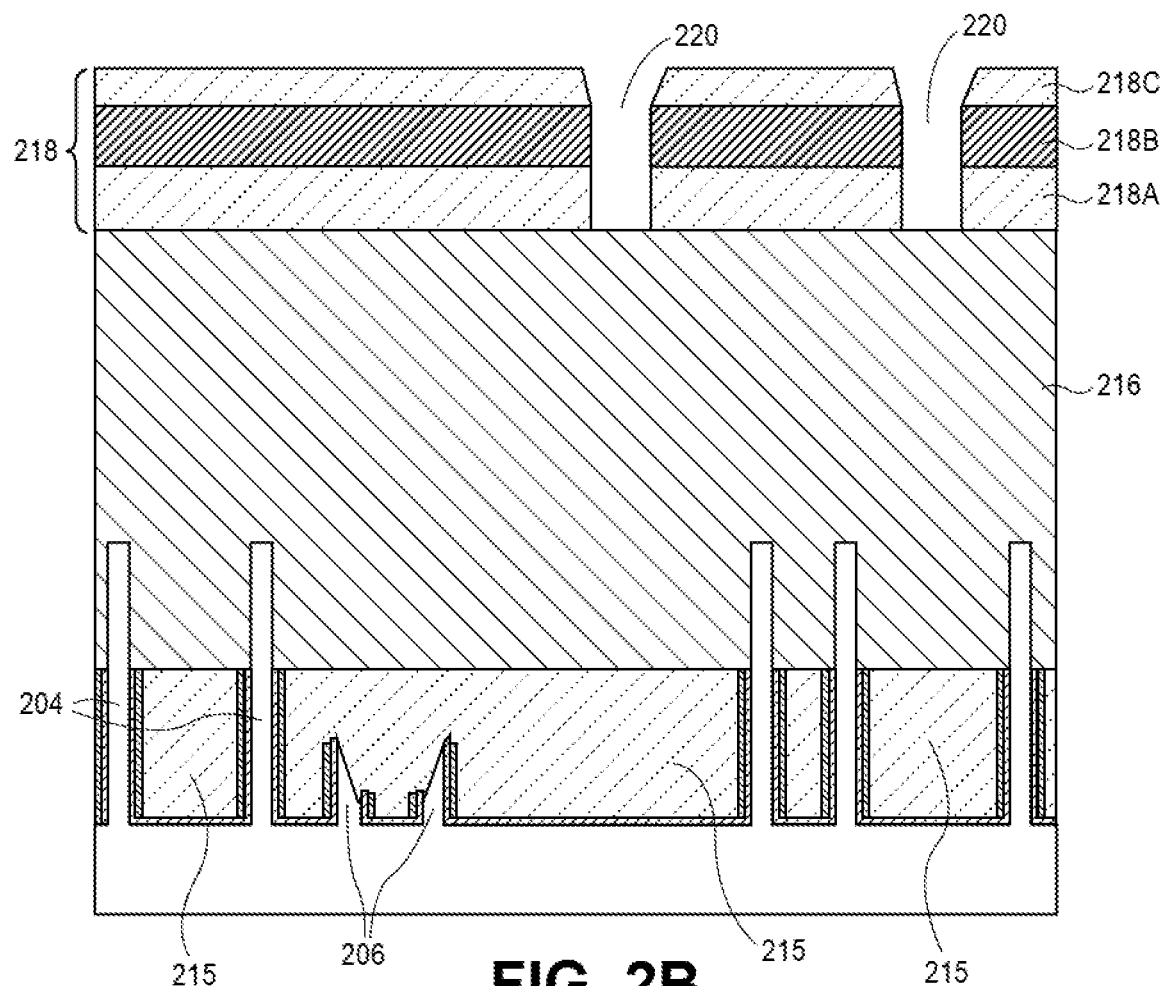

Referring to FIG. 2B, the isolation material 214 is recessed to form trench isolation material 215. Also, if included, isolation layer 208 and fin spacers 210 are recessed along the fins 204, and fin cap 212 is removed from the fins 204. A hardmask layer 216, such as a carbon hardmask layer is formed over the resulting structure. A mask 218, such as trilayer mask composed of a topographic masking portion 218A, an anti-reflective coating (ARC) layer 218B, and a photoresist layer 218C, is formed on the hardmask layer 216. Lithography is used to form openings 220 in the mask 218, which may be referred to as plug definition openings.

Figure 2C:
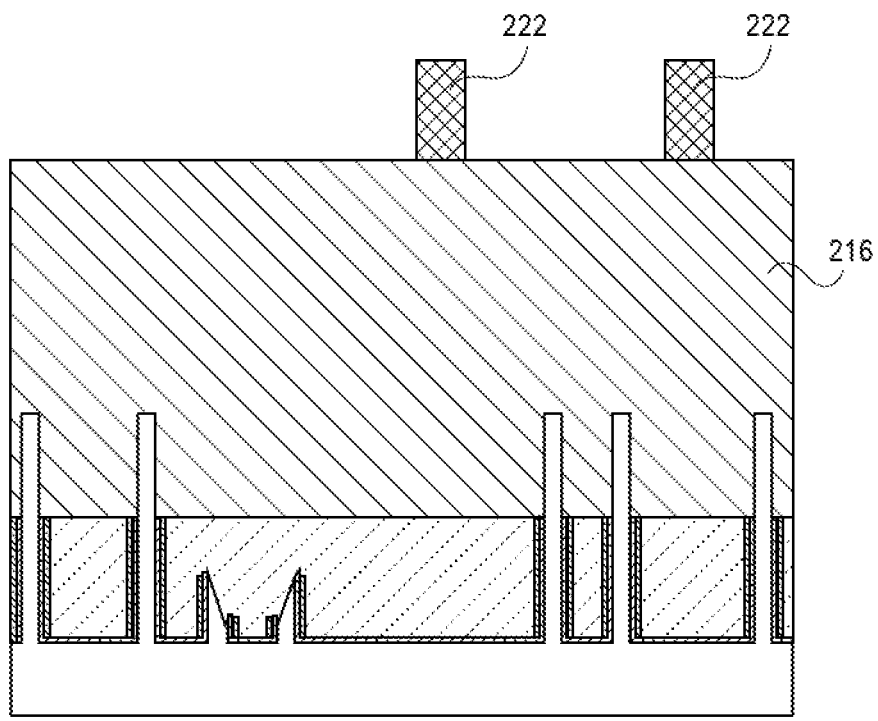

Referring to FIG. 2C, a pattern inversion and mask removal process is performed. A mask material 222 is formed in the openings 220 of mask 218. Mask 218 is then removed.

Figure 2D:
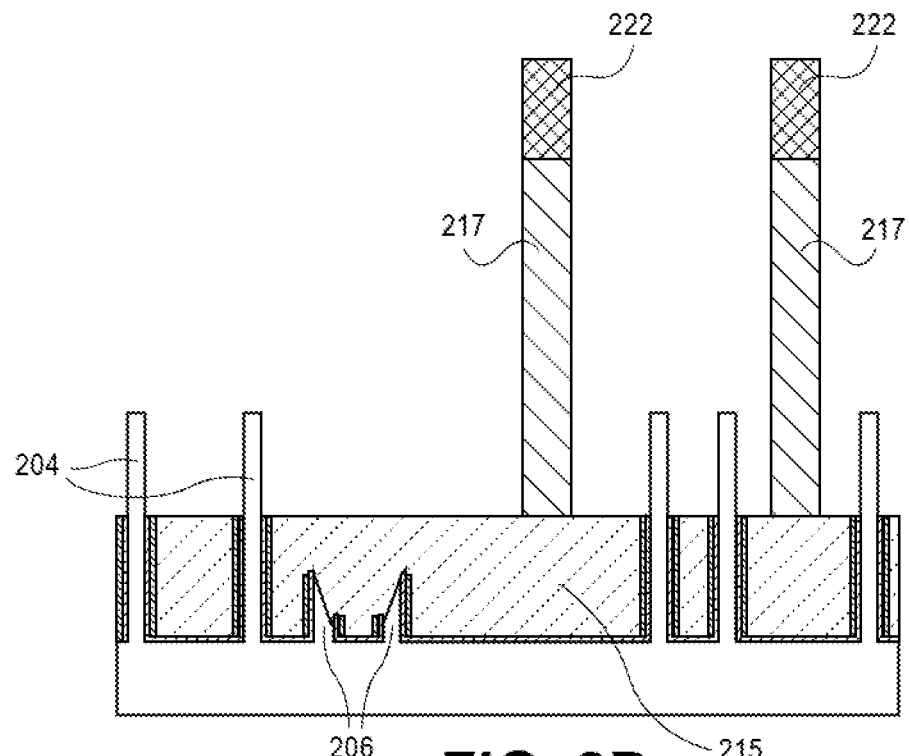

Referring to FIG. 2D, a post pattern transfer etch operation is performed. The mask material 222 is used as an etch mask during etching of hardmask layer 216 to form hardmask pillars or walls 217.

Figure 2E:
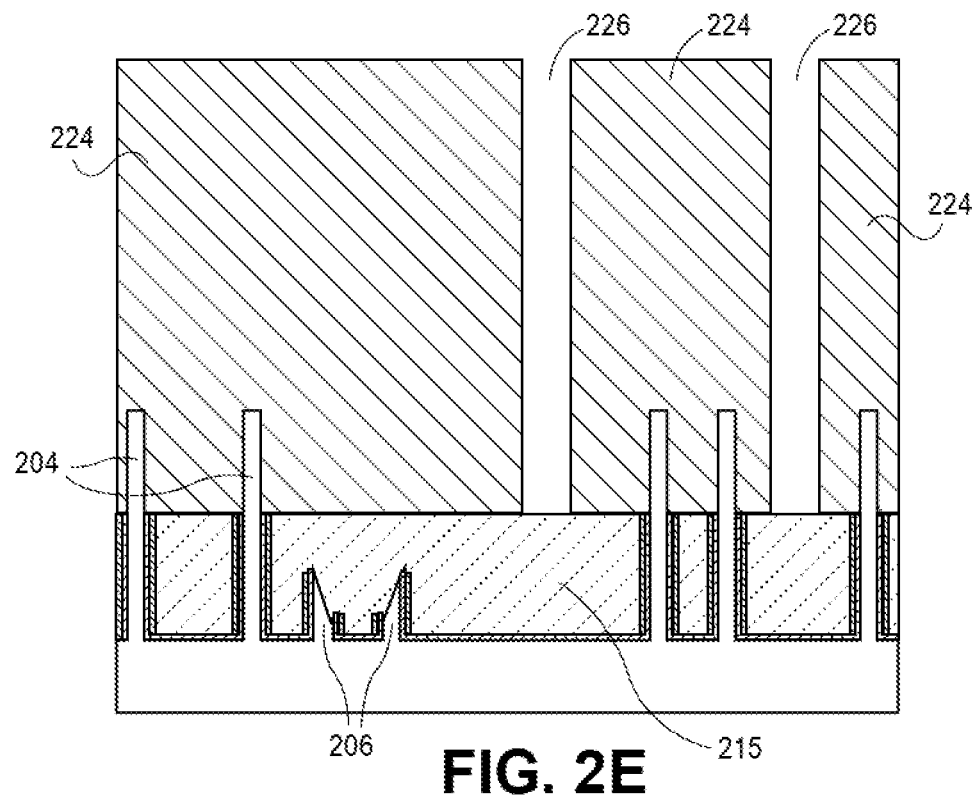

Referring to FIG. 2E, a post pattern inversion operation is performed. A sacrificial material 224 is formed over the structure of FIG. 2D. The sacrificial material 224 is planarized to expose hardmask pillars or walls 217 and any remaining portions of mask material 222. The hardmask pillars or walls 217 and any remaining portions of mask material 222 are removed to form openings 226.

Figure 2F:
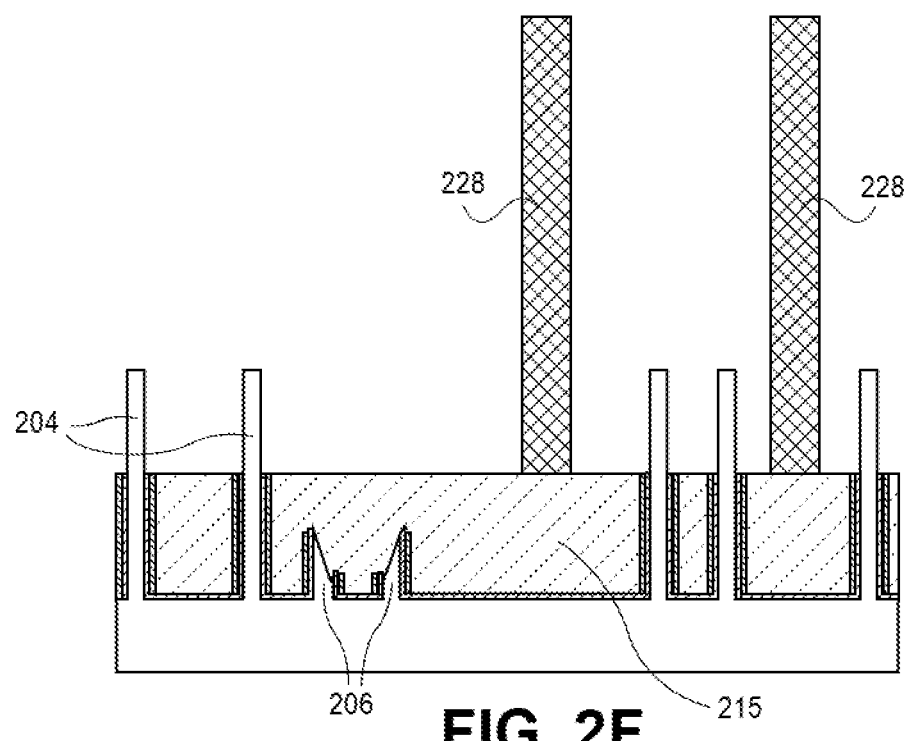

Referring to FIG. 2F, a realigned plug deposition operation is performed. Gate endcap isolation structures 228 are formed in the openings 226 in sacrificial material 224. The sacrificial material 224 is then removed. The formation of gate endcap isolation structures 228 may involve a deposition, planarization, and cleans process.

Figure 2G:
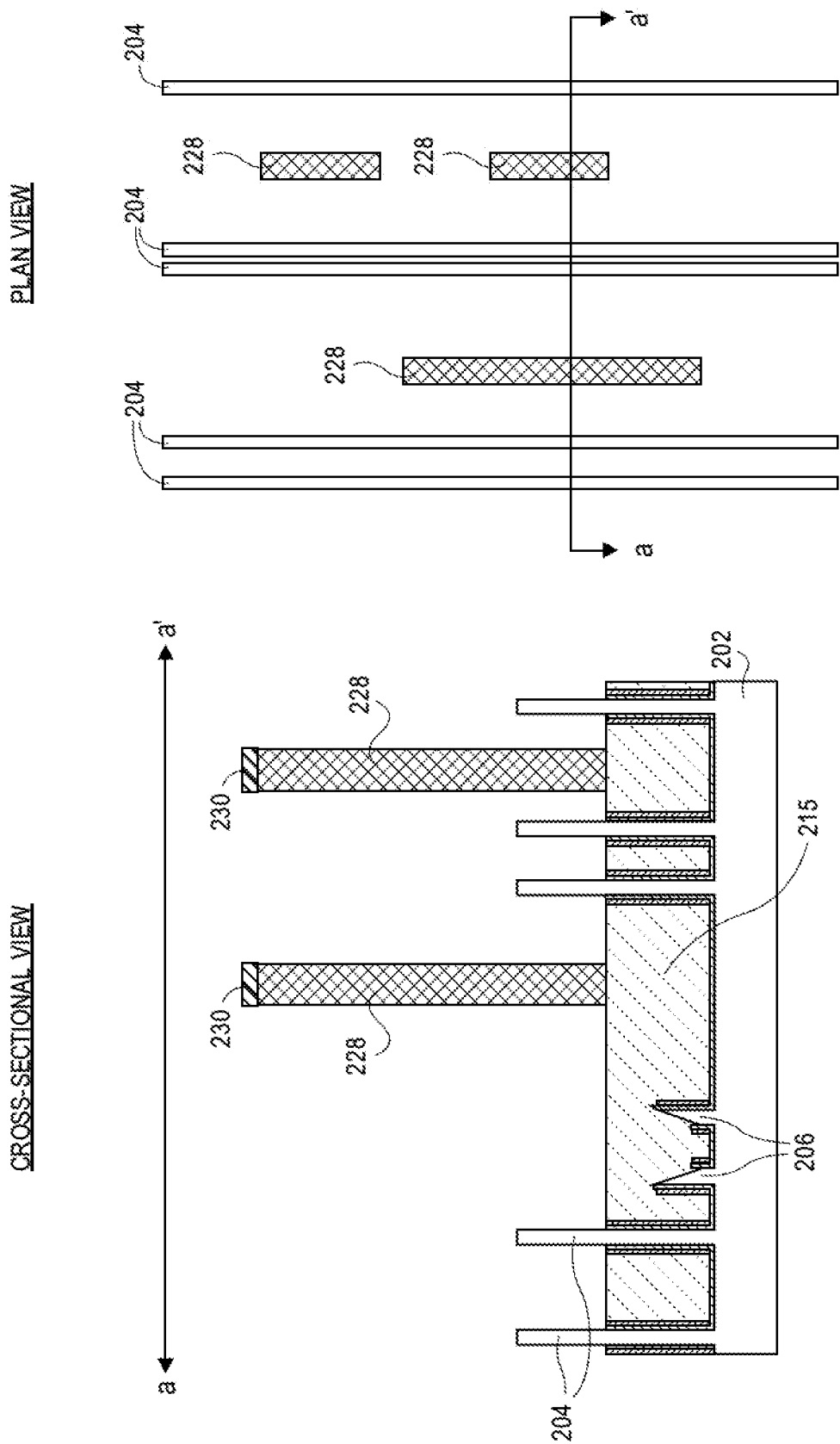

Referring to FIG. 2G, a post plug helmet formation operation may be performed. For example, a dielectric cap 230 can be formed on tops of the gate endcap isolation structures 228. In either case, i.e., whether or not a cap 230 is formed, a plan view of the resulting structure reveals the gate endcap isolation structures 228 formed along a same direction as the fins. However, the gate endcap isolation structures 228 may be formed as segments along the second directions, as is depicted. It is to be appreciated that the cross-sectional view of FIG. 2G is taken along the a-a' axis of the plan view of FIG. 2G.

Figure 2H:
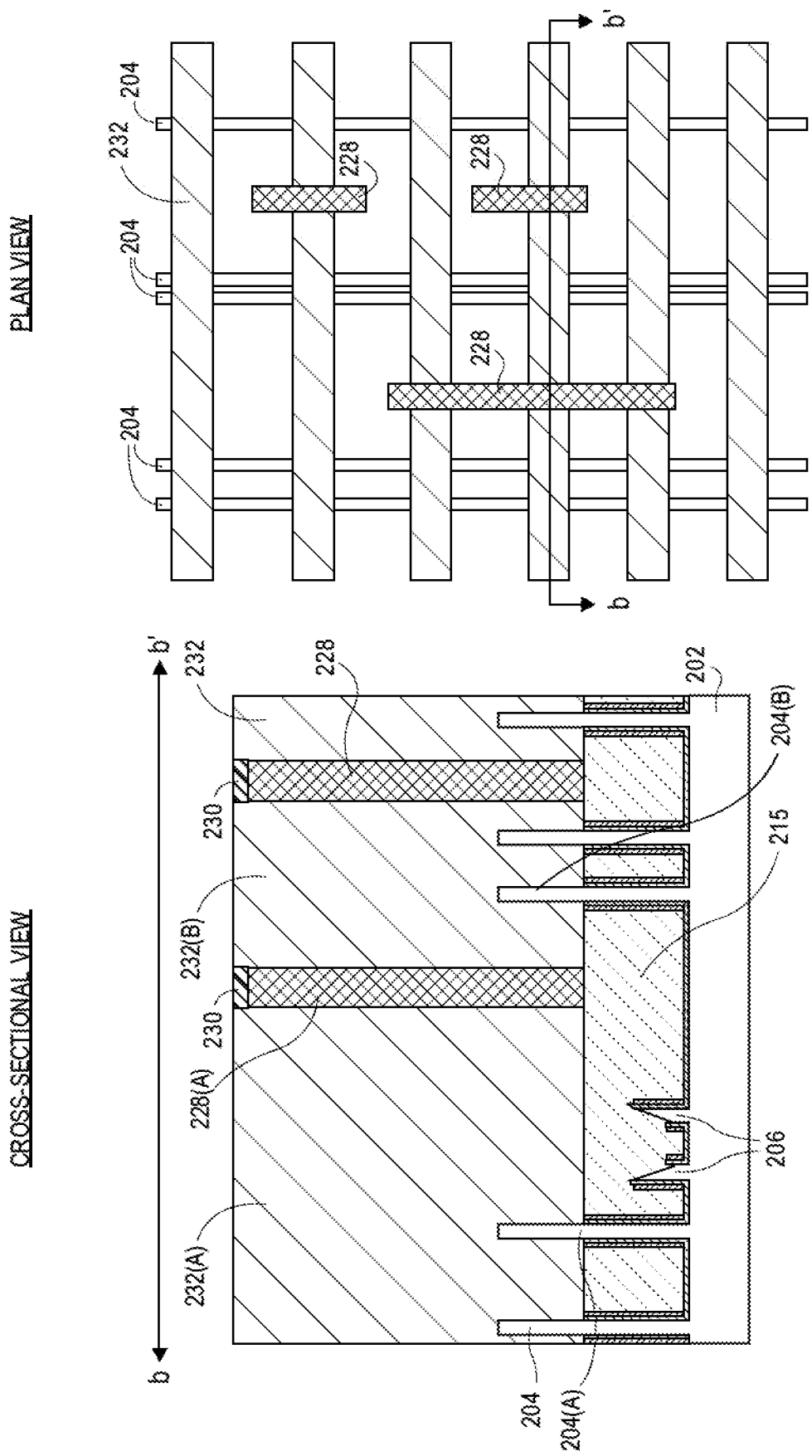

Referring to FIG. 2H, gate stacks 232 are formed over the structure of FIG. 2H. In an embodiment, the gate structures are formed as gridded lines over the fins 204 along a direction orthogonal or perpendicular to the fins 204, as is depicted. In one embodiment, tops of the gate stacks 232 are co-planar with the gate endcap isolation structures 228. For illustrative purposes, FIG. 2H can be viewed as an intermediate structure, e.g., where the depicted gate stacks 232 are sacrificial (e.g., polysilicon), and are later replaced with permanent gate stacks in a replacement gate process. For example, an inter-layer dielectric material can be formed between the gate stacks, the gate stacks can then be removed, and permanent gate stacks, e.g., metal gate and high-k gate dielectric gate stacks, can then be formed. Alternatively, illustrative purposes, FIG. 2H can be viewed as a final structure where the gate stacks 232 shown are the permanent gate stacks, with an inter-layer dielectric material there between (as would be viewable from the plan view). In the latter case, regions where gate stacks 232 intersect with gate endcap isolation structures 228 provide a break in the continuity of the gate stack in a restrictive space, without having to accommodate for mis-registration during a gate cut. In locations where the gate endcap isolation structures 228 extend beyond the gate stacks 232 along the direction of the fins 204, the gate endcap isolation structures 228 can actually act as trench contact endcaps in those locations.

In accordance with an embodiment of the present disclosure, with reference again to FIG. 2H, an integrated circuit structure includes a first semiconductor fin 204(A) along a first direction. A second semiconductor fin 204(B) is along the first direction. A trench isolation material 215 is between the first semiconductor fin 204(A) and the second semiconductor fin 204(B). The trench isolation material 215 has an uppermost surface below a top of the first and second semiconductor fins 204(A) and 204(B). A gate endcap isolation structure 228(A) is between the first semiconductor fin 204(A) and the second semiconductor fin 204(B) and is along the first direction. The gate endcap isolation structure 228(A) is on the uppermost surface of the trench isolation material 215, e.g., as opposed to being recessed into the trench isolation material 215. A first gate structure 232(A) is along a second direction orthogonal to the first direction. The first gate structure 232(A) is over the first semiconductor fin 204(A) and in contact with a first side of the gate endcap isolation structure 228(A). A second gate structure 232(B) is along the second direction. The second gate structure 232(B) is over the second semiconductor fin 204(B) and in contact with a second side of the gate endcap isolation structure 228(A).

In an embodiment, the gate endcap isolation structure 228(A) extends beyond the first and second gate structures 232(A) and 232(B) along the first direction, as is depicted in the plan view of FIG. 2H. In an embodiment, a first sidewall spacer (such as spacer 133 described in association with FIG. 1) is along sides of the first gate structure 232(A), and a second sidewall spacer is along sides of the second gate structure 232(B). In one such embodiment, the gate endcap isolation structure 228(A) is not within the first sidewall spacer or the second sidewall spacer, e.g., since the gate endcap isolation structure 228(A) is formed prior to forming gate structures and associated sidewall spacers.

In an embodiment, the gate endcap isolation structure 228 (and, possibly including cap 230) has top surface above the top of the first and second semiconductor fins 204(A) and 204(B), as is depicted. In an embodiment, the gate endcap isolation structure includes a lower dielectric portion 228 and a dielectric cap 230 on the lower dielectric portion. In an embodiment, the integrated circuit structure further includes a through fin isolation structure, where an end of the second gate structure 232(B) is in contact with the through fin isolation structure, such as described in association with FIG. 1. In one such embodiment, a sidewall spacer is along sides of the second gate structure, and the gate endcap isolation structure (formed prior) is not within the sidewall spacer, but the through fin isolation structure (formed after) is within the sidewall spacer. In an embodiment, the through fin isolation structure has a bottom surface below a bottom surface of the gate endcap isolation structure, as shown in FIG. 1.

In another aspect, it may desirable to remove portions of the gate endcap isolation structures 228 that extend beyond the gate stacks in order to allow for trench contact continuity, effectively remove at least some of the trench contact endcap portions. As an example, FIG. 3 illustrates a cross-sectional view and a plan view of an integrated circuit structure having a gate endcap isolation structure, in accordance with an embodiment of the present disclosure.

Figure 3:
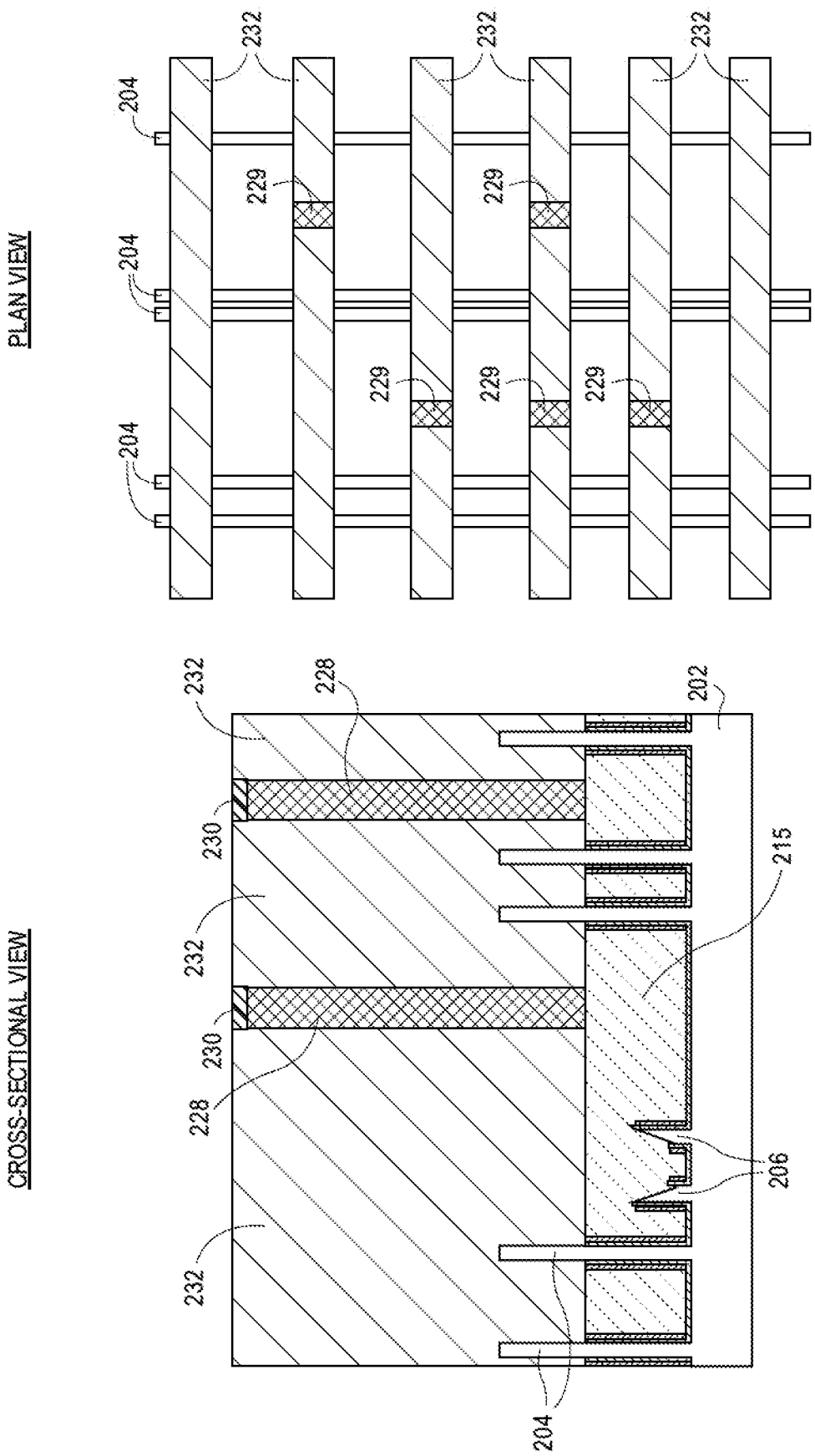
FIG. 3 illustrates a cross-sectional view and a plan view of an integrated circuit structure having a gate endcap isolation structure, in accordance with an embodiment of the present disclosure.

Referring to FIG. 3, the portions of the gate endcap isolation structures 228 that extend beyond the gate stacks 232 along the direction of the fins 204 are removed prior to permanent gate stack formation. For illustrative purposes, reduced gate endcap isolation structures 229 are formed by removing all portions of the gate endcap isolation structures 228 that extend beyond the gate stacks 232 along the direction of the fins 204 are removed prior to permanent gate stack formation. The result leaves only gate endcap, but not trench contact endcap. It is to be appreciated, however, that some locations of endcap may need to be preserved for trench contact endcap purposes. As an example, FIGS. 4A and 4B illustrate cross-sectional views representing various operations in a method of fabricating an integrated circuit structure having a trench contact endcap isolation structure, in accordance with an embodiment of the present disclosure.

Figure 4A:
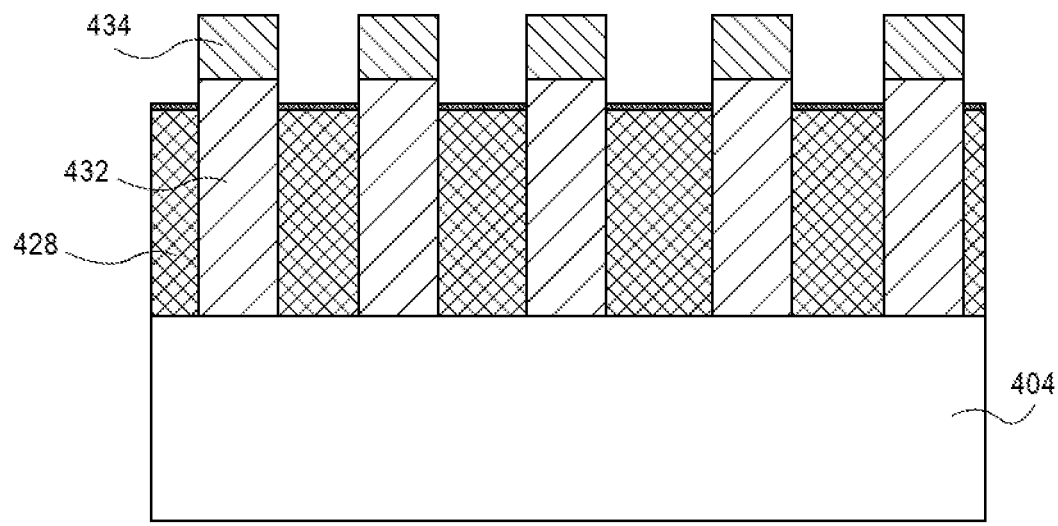
FIGS. 4A and 4B illustrate cross-sectional views representing various operations in a method of fabricating an integrated circuit structure having a trench contact endcap isolation structure, in accordance with an embodiment of the present disclosure.
Figure 4B:
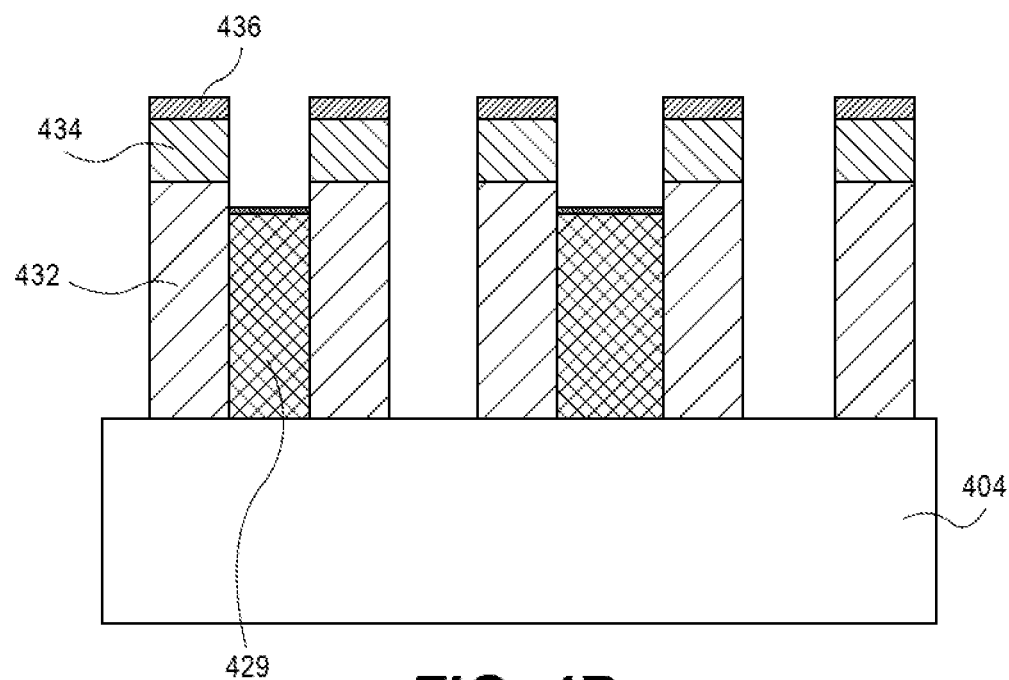

Referring to FIG. 4A, a fin 404 has a plurality of gate stack stacks 432 (which may include a hardmask 434) thereon. A gate endcap isolation structure 428 is depicted behind the fin 404, i.e., behind the portions of the gate stacks 432 on the fin 404. In this case, the gate stack stacks 432 have not yet been planarized to a height of the gate endcap isolation structure 428 and, as such, extend from the fin and cover portions of the gate endcap isolation structure 428. Select portions of the gate endcap isolation structure 428 are then removed between the gate stack stacks 432 to effectively remove trench contact endcaps in some locations while leaving trench contact endcaps (or trench plugs) 429 in other locations as shown in FIG. 4B. The resulting structure can then be further processed through a permanent gate formation and planarization process.

To provide broader context for embodiments described herein, state-of-the-art approaches have relied on lithographic scaling of the gate end to end (poly cut) to define a minimum technology gate overlap of diffusion. The minimum technology gate overlap of diffusion is a key component in diffusion end to end space. An associated gate line (poly cut) process has typically been limited by lithography, registration, and etch bias considerations, and ultimately sets the minimum diffusion end to end distance. Other approaches such as contact over active gate (COAG) architectures have worked to improve such diffusion spacing capability. However, improvements in this technology arena remain highly sought after.

To provide a foundation to highlight advantages of embodiments of the present disclosure, it is first to be appreciated that advantages of a gate endcap isolation structure architecture over non-endcap approaches may include the enabling of higher layout density and, in particular, scaling of diffusion to diffusion spacing. As an example, FIG. 5 illustrates plan views of adjacent integrated circuit structures for a conventional architecture with relatively wide spacing (left-hand side (a)) versus adjacent integrated circuit structures for a gate endcap isolation structure architecture with relatively tight spacing (right-hand side (b)), in accordance with an embodiment of the present disclosure.

Figure 5:
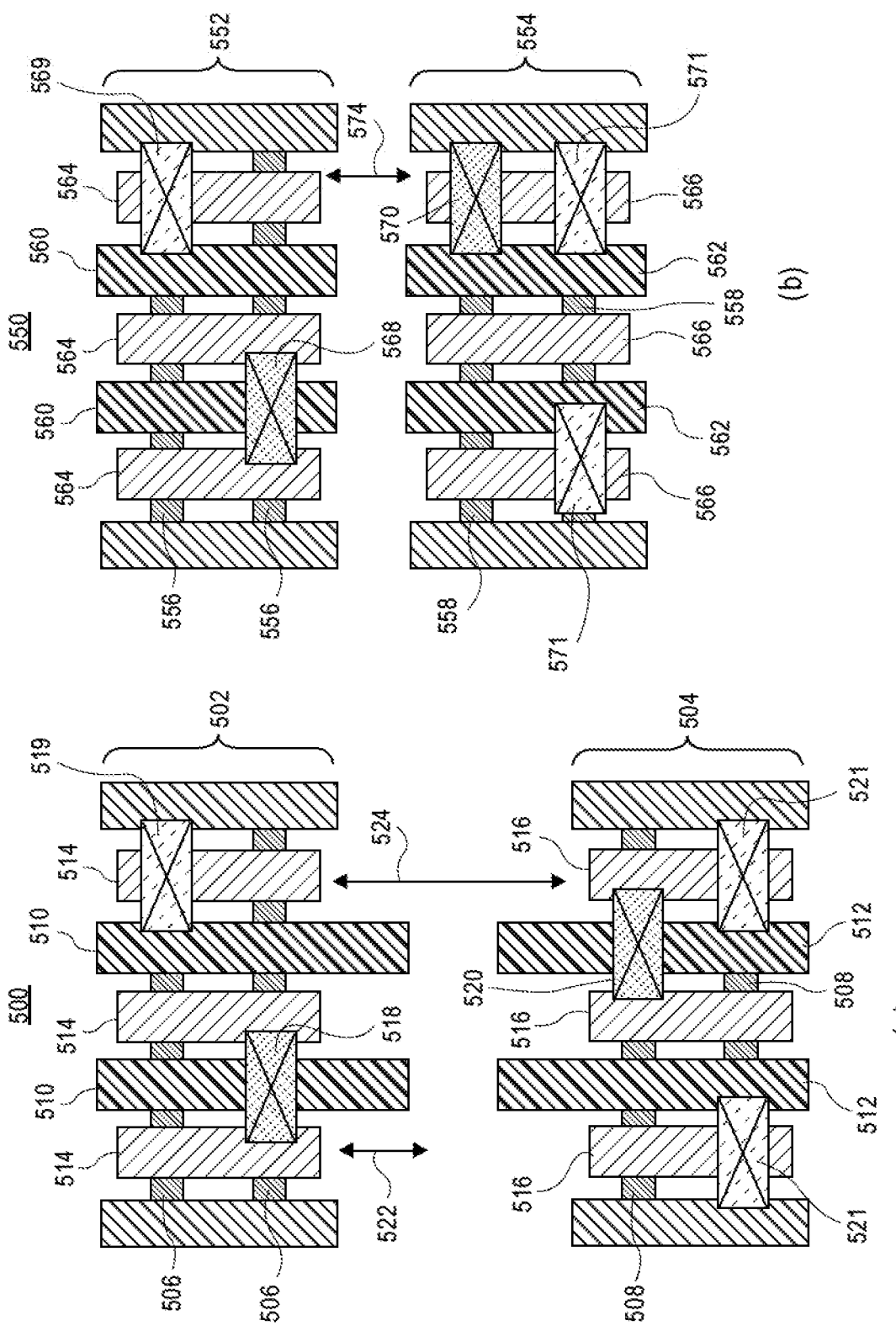
FIG. 5 illustrates plan views of adjacent integrated circuit structures for a conventional architecture with relatively wide spacing (left-hand side (a)) versus adjacent integrated circuit structures for a gate endcap architecture with relatively tight spacing (right-hand side (b)), in accordance with an embodiment of the present disclosure.

Referring to the left-hand side (a) of FIG. 5, a layout 500 includes first 502 and second 504 integrated circuit structures based on semiconductor fins 506 and 508, respectively. Each device 502 and 504 has a gate electrode 510 or 512, respectively. Additionally, each device 502 and 504 has trench contacts (TCNs) 514 or 516, respectively, at source and drain regions of the fins 506 and 508, respectively. Gate vias 518 and 520, and trench contact vias 519 and 521, respectively, are also depicted.

Referring again to the left-hand side (a) of FIG. 5, the gate electrodes 510 and 512 have a relatively wide end cap region 522, which is located off of the corresponding fins 506 and 508, respectively. The TCNs 514 and 516 each have a relatively large end-to-end spacing 524, which is also located off of the corresponding fins 506 and 508, respectively.

By contrast, referring to the right-hand side (b) of FIG. 5, a layout 550 includes first 552 and second 554 integrated circuit structures based on semiconductor fins 556 and 558, respectively. Each device 552 and 554 has a gate electrode 560 or 562, respectively. Additionally, each device 552 and 554 has trench contacts (TCNs) 564 or 566, respectively, at source and drain regions of the fins 556 and 558, respectively. Gate vias 568 and 570, and trench contact vias 569 and 571, respectively, are also depicted.

Referring again to the right-hand side (b) of FIG. 5, the gate electrodes 560 and 562 have a relatively tight end cap region, which is located off of the corresponding fins 556 and 558, respectively. The TCNs 564 and 566 each have a relatively tight end-to-end spacing 574, which is also located off of the corresponding fins 556 and 558, respectively.

To provide further context, scaling of gate endcap and trench contact (TCN) endcap regions are important contributors towards improving transistor layout area and density. Gate and TCN endcap regions refer to gate and TCN overlap of the diffusion region/fins of semiconductor devices. As an example, FIG. 6 illustrates a plan view of a conventional layout 600 including fin-based semiconductor devices accommodating end-to-end spacing.

Figure 6:
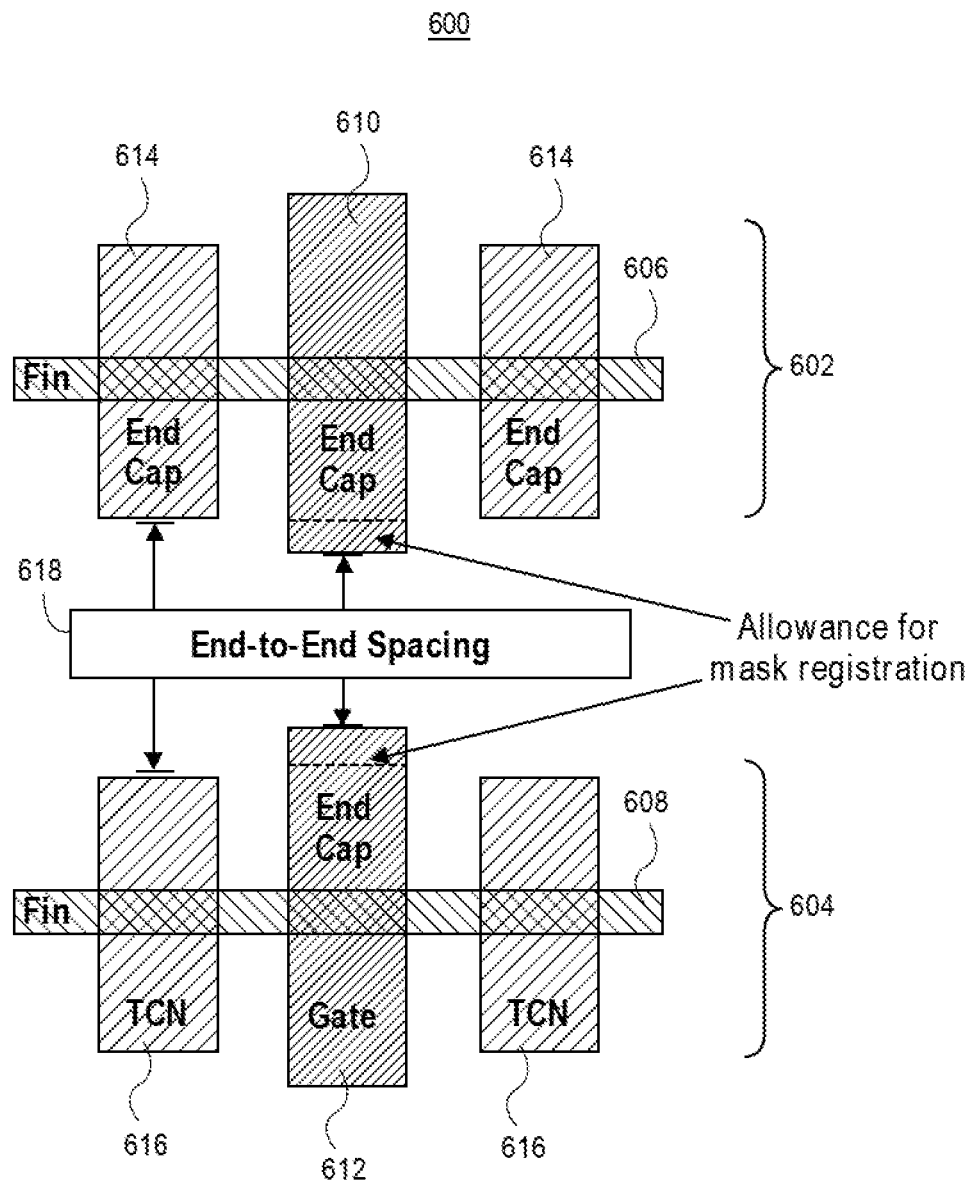
FIG. 6 illustrates a plan view of a conventional layout including fin-based semiconductor devices accommodating end-to-end spacing.

Referring to FIG. 6, first 602 and second 604 semiconductor devices are based on semiconductor fins 606 and 608, respectively. Each device 602 and 604 has a gate electrode 610 or 612, respectively. Additionally, each device 602 and 604 has trench contacts (TCNs) 614 or 616, respectively, at source and drain regions of the fins 606 and 608, respectively. The gate electrodes 610 and 612 and the TCNs 614 and 616 each have an end cap region, which is located off of the corresponding fins 606 and 608, respectively.

Referring again to FIG. 6, typically, gate and TCN endcap dimensions must include an allowance for mask registration error to ensure robust transistor operation for worst case mask mis-registration, leaving an end-to-end spacing 618.

Thus, another important design rule critical to improving transistor layout density is the spacing between two adjacent endcaps facing each other. However, the parameters of "2*Endcap+End-to-End Spacing" are becoming increasingly difficult to scale using lithographic patterning to meet the scaling requirements for new technologies. In particular, the additional endcap length required to allow for mask registration error also increases gate capacitance values due to longer overlap length between TCN and gate electrodes, thereby increasing product dynamic energy consumption and degrading performance. Previous solutions have focused on improving registration budget and patterning or resolution improvements to enable shrinkage of both endcap dimension and endcap-to-endcap spacing.

In accordance with an embodiment of the present disclosure, approaches are described which provide for gate endcap and, possibly, TCN overlap of a semiconductor fin without any need to allow for mask registration. Furthermore, approaches described herein do not necessarily require lithographic patterning at previously required stages since the gate and TCN endcap/overlap dimensions remain fixed, leading to improvement (i.e., reduction) in device to device variability in electrical parameters.

In another aspect, gate endcap isolation structures may vary by width, location, and function with respect to differing devices. In an exemplary implementation, system-on-chip (SoC) process technologies typically require support of standard logic (e.g., low voltage, thin-oxide) and I/O (e.g., high voltage, thick-oxide) transistors. The distinction between standard logic and high voltage (HVI/O) devices may be accomplished through a multi-oxide process sequence, where logic transistors receive a thin, high-performance oxide and I/O devices receive a thick oxide capable to sustain higher voltages. As process technologies scale, the logic devices aggressively scale in dimension, creating fabrication challenges with dual-oxide formation. In accordance with one or more embodiments of the present disclosure, a high voltage endcap process is combined with an ultra-scaled finfet transistor architecture to provide a multi-gate endcap isolation structures process.

To provide context, as technology nodes scale smaller, there is an increasing lack of geometrical space in a narrow-endcap logic device to accommodate a defect-free dual oxide process that may be needed for high-voltage transistor fabrication. Current approaches rely upon a single, unscaled endcap space to accommodate a single logic oxide process. However, such a process may be incompatible with highly scaled geometries supporting a dual-oxide high-voltage SoC technology, since the endcap space may be insufficient to accommodate both oxides (gate dielectrics).

In accordance with an embodiment of the present disclosure, scaling limitations imposed by requirements fill high-voltage gates with both the high-voltage oxide and logic oxide are addressed. In particular, as logic dimensions decrease, the endcap space in high voltage (HV) devices becomes insufficiently narrow to fill both oxides. In an embodiment, different endcap spaces between logic transistor and high-voltage transistor, respectively, are fabricated in a gate endcap isolation structure architecture. The logic transistor endcap is ultra-scaled by using a narrower endcap architecture, while the high-voltage transistor has a wider endcap to accommodate a thicker gate dielectric. One or both of the types of endcaps can be fabricated without a fin end gap, in accordance with embodiments described herein.

Figure 7A:
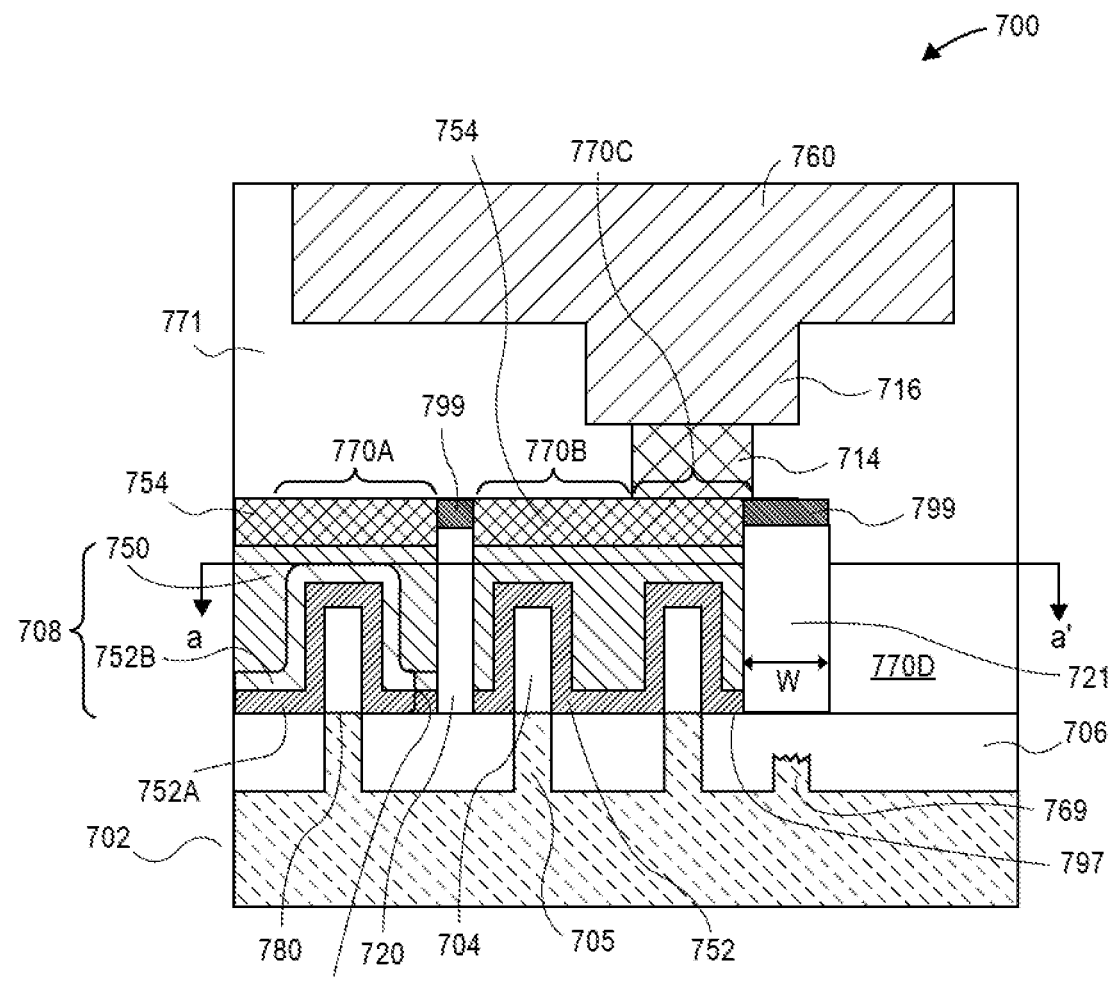
FIG. 7A illustrates a cross-sectional view of non-planar semiconductor devices having a gate endcap isolation structure architecture, in accordance with an embodiment of the present disclosure.
Figure 7B:
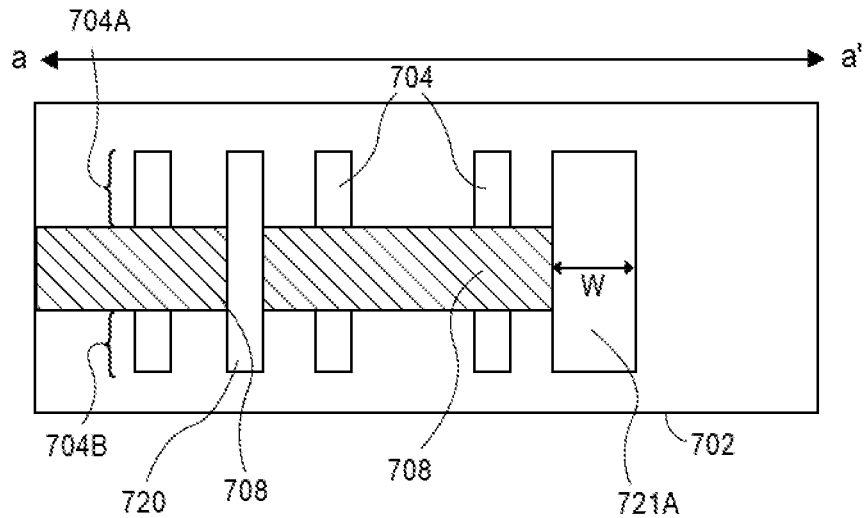
FIG. 7B illustrates a plan view taken along the a-a' axis of the semiconductor devices of FIG. 7A, in accordance with an embodiment of the present disclosure.

As an example of completed devices, FIG. 7A illustrates a cross-sectional view of non-planar semiconductor devices having a multi-gate endcap isolation structure architecture, in accordance with an embodiment of the present disclosure. FIG. 7B illustrates a plan view taken along the a-a' axis of the structure of FIG. 7A, in accordance with an embodiment of the present disclosure.

Referring to FIG. 7A, a semiconductor structure 700 includes non-planar active regions (e.g., fin structures each including a protruding fin portion 704 and a sub-fin region 705) formed from substrate 702, and within a trench isolation layer 706. In an embodiment, the fin structures are a plurality of fin lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like fin patterns may have lines spaced at a constant pitch and having a constant width. The pattern may be fabricated by a pitch halving or pitch quartering, or other pitch division, approach. Each of the individual fins 704 depicted may represent corresponding individual fins, or may represent a plurality of fins at a given location.

Gate structures 708 are over the protruding portions 704 of the non-planar active regions as well as over a portion of the trench isolation layer 706. As shown, gate structures 708 includes a gate electrode 750, a gate dielectric layer 752, and a conductive gate fill 754. In one embodiment, although not shown, gate structures 708 may also include a dielectric cap layer.

Gate structures 708 are separated by a narrow gate endcap isolation structure 720 and a wide gate endcap isolation structure 721. Gate endcap isolation structures of differing width may be associated with different device types, as described in exemplary embodiments herein. It is to be appreciated that the varying of widths for gate endcap isolation structures can be rearranged. Also, in other embodiments, the widths are all the same. Each gate endcap isolation structure 720 and 721 may include a dielectric cap or helmet 799 formed thereon. In an embodiment, each gate endcap isolation structure 720 and 721 is on an uppermost surface 797 of the trench isolation layer 706, e.g., having a bottom surface no lower than the uppermost surface 797 of the trench isolation layer 706, as is depicted in FIG. 7A.

In accordance with an embodiment of the present disclosure, gate endcap isolation structure 721 is formed in a location of a cut fin. In a particular embodiment, gate endcap isolation structure 721 is formed over a cut portion 769 of a fin, as is depicted. In an embodiment, gate endcap isolation structures are fabricated subsequent to a fin cut process.

In an exemplary embodiment, the semiconductor structure 700 includes a first plurality of semiconductor fins (fin or fins 704 of region 770A) above a substrate 702 and protruding through an uppermost surface 797 of a trench isolation layer 706, and a first gate structure (gate structure 708 of region 770A) over the first plurality of semiconductor fins. A second plurality of semiconductor fins (fin or fins 704 of region 770B and 770C) is above the substrate 702 and protrudes through the uppermost surface 797 of the trench isolation layer 706, and a second gate structure (gate structure 708 of regions 770B and 770C) is over the second plurality of semiconductor fins. In one embodiment, a semiconductor fin of region 770A closest to the gate endcap isolation structure 720 is spaced farther from the gate endcap isolation structure 720 than a semiconductor fin of region 770B/770C closest to the gate endcap isolation structure 720.

In an embodiment, region 770A is an I/O region, and region 770B/770C is logic region. Another region 770D may be a location where an additional logic or I/O region may be placed. Embodiments described herein may involve differential spacing from a gate endcap isolation structure, or may involve gate endcap isolation structures of differing width, or both differential spacing from a gate endcap isolation structure and gate endcap isolation structures of differing width. In an embodiment, I/O regions have a greater spacing between gate endcap isolation structures than a logic region. In an embodiment, a wider gate endcap isolation structure is between adjacent logic regions than is between adjacent I/O regions.

A gate contact 714, and overlying gate contact via 716 are also seen from this perspective, along with an overlying metal interconnect 760, all of which are in inter-layer dielectric stacks or layers 771. Also seen from the perspective of FIG. 7A, the gate contact 714 is, in one embodiment, over the non-planar active regions. As is also depicted in FIG. 7A, an interface 780 exists between a doping profile of protruding fin portions 704 and sub-fin regions 705, although other embodiments do not include such an interface in doping profile between these regions.

Referring to FIG. 7B, the gate structures 708 are shown as over the protruding fin portions 704, as isolated by gate endcap isolation structures 720 and 721. In an embodiment, the gate structures 708 form one line of a plurality of parallel gate lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like gate patterns may have lines spaced at a constant pitch and having a constant width. The pattern may be fabricated by a pitch halving or pitch quartering, or other pitch division, approach.

Referring again to FIG. 7B, source and drain regions 704A and 704B of the protruding fin portions 704 are shown in this perspective, although it is to be appreciated that these regions would be overlapped with trench contact structures. In one embodiment, the source and drain regions 704A and 704B are doped portions of original material of the protruding fin portions 704. In another embodiment, the material of the protruding fin portions 704 is removed and replaced with another semiconductor material, e.g., by epitaxial deposition. In either case, the source and drain regions 704A and 704B may extend below the height of trench isolation layer 706, i.e., into the sub-fin region 705.

In an embodiment, the semiconductor structure 700 includes non-planar devices such as, but not limited to, a finFET or a tri-gate device. In such an embodiment, a corresponding semiconducting channel region is composed of or is formed in a three-dimensional body. In one such embodiment, the gate structures 708 surround at least a top surface and a pair of sidewalls of the three-dimensional body.

Substrate 702 may be composed of a semiconductor material that can withstand a manufacturing process and in which charge can migrate. In an embodiment, substrate 702 is a bulk substrate composed of a crystalline silicon, silicon/germanium or germanium layer doped with a charge carrier, such as but not limited to phosphorus, arsenic, boron or a combination thereof, to form active region 704. In one embodiment, the concentration of silicon atoms in bulk substrate 702 is greater than 97%. In another embodiment, bulk substrate 702 is composed of an epitaxial layer grown atop a distinct crystalline substrate, e.g. a silicon epitaxial layer grown atop a boron-doped bulk silicon mono-crystalline substrate. Bulk substrate 702 may alternatively be composed of a group III-V material. In an embodiment, bulk substrate 702 is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 702 is composed of a group III-V material and the charge-carrier dopant impurity atoms are ones such as, but not limited to, carbon, silicon, germanium, oxygen, sulfur, selenium or tellurium.

Trench isolation layer 706 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the trench isolation layer 706 is composed of a dielectric material such as, but not limited to, silicon dioxide, silicon oxy-nitride, silicon nitride, or carbon-doped silicon nitride.

Gate endcap isolation structures 720 and 721 may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

Gate structures 708 may be composed of a gate electrode stack which includes a gate dielectric layer 752 and a gate electrode layer 750. In an embodiment, the gate electrode of the gate electrode stack is composed of a metal gate and the gate dielectric layer includes a high-k material. A gate fill material 754 may be on the gate electrode layer 750, as is depicted. In an exemplary embodiment, the gate structure 708 of region 770A includes a first gate dielectric 752 conformal with the first plurality of semiconductor fins and laterally adjacent to and in contact with a first side of the gate endcap isolation structure 720. The second gate stack of region 770B/770C includes a second gate dielectric 752 conformal with the second plurality of semiconductor fins and laterally adjacent to and in contact with a second side of the gate endcap isolation structure opposite the first side of the gate endcap isolation structure. In one embodiment, the first gate dielectric is thicker than the second gate dielectric, as is depicted in FIG. 7A. In one embodiment, the first gate dielectric has more dielectric layers (e.g., layers 752A and 752B) than the second gate dielectric (e.g., only layer 752). In an embodiment, the gate dielectric of region 770A is an I/O gate dielectric, and the gate dielectric of region 770B/770C is a logic gate dielectric.

In an embodiment, the gate dielectric of region 770B/770C is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 702. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In an embodiment, the top high-k portion consists of a "U"-shaped structure that includes a bottom portion substantially parallel to the surface of the substrate and two sidewall portions that are substantially perpendicular to the top surface of the substrate. In an embodiment, the gate dielectric of region 770A includes a layer of non-native silicon oxide in addition to a layer of high-k material. The layer of non-native silicon oxide may be formed using a CVD process and may be formed below or above the layer of high-k material. In an exemplary embodiment, the layer of non-native silicon oxide (e.g., layer 752A) is formed below a layer of high-k material (e.g., layer 752B).

In one embodiment, the gate electrode 750 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode 750 may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 714, overlying gate contact via 716, and overlying metal interconnect 760 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). A common example is the use of copper structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc.

In an embodiment (although not shown), providing structure 700 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate structures 708 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 700. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 7A, in an embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that, as exemplified in FIGS. 7A and 7B, gate endcap isolation structures of varying width may be fabricated. It is also to be appreciated that fabrication of gate endcap isolation structures may lead to formation of a seam within the gate endcap isolation structures. It is also to be appreciated that a stack of dielectric layers may be used to form a gate endcap isolation structure. It is also to be appreciated that gate endcap isolation structures may differ in composition depending on the spacing of adjacent fins.

One or more embodiments described above are directed to gate endcap isolation structures for FinFET devices. It is to be appreciated that other embodiments may include the application of such approaches for fins composed of alternating layers of two dissimilar semiconductor materials (e.g., Si and SiGe or SiGe and Ge). One of the pairs of dissimilar semiconductor materials can then be removed in the gate region to provide nanowire/nanoribbon channels for gate all-around devices. In an embodiment, an approach for gate all-around devices is similar to the approaches described above for FinFETs, with the addition of a nanowire/ribbon release operation in the gate region.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Mo, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion lithography (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
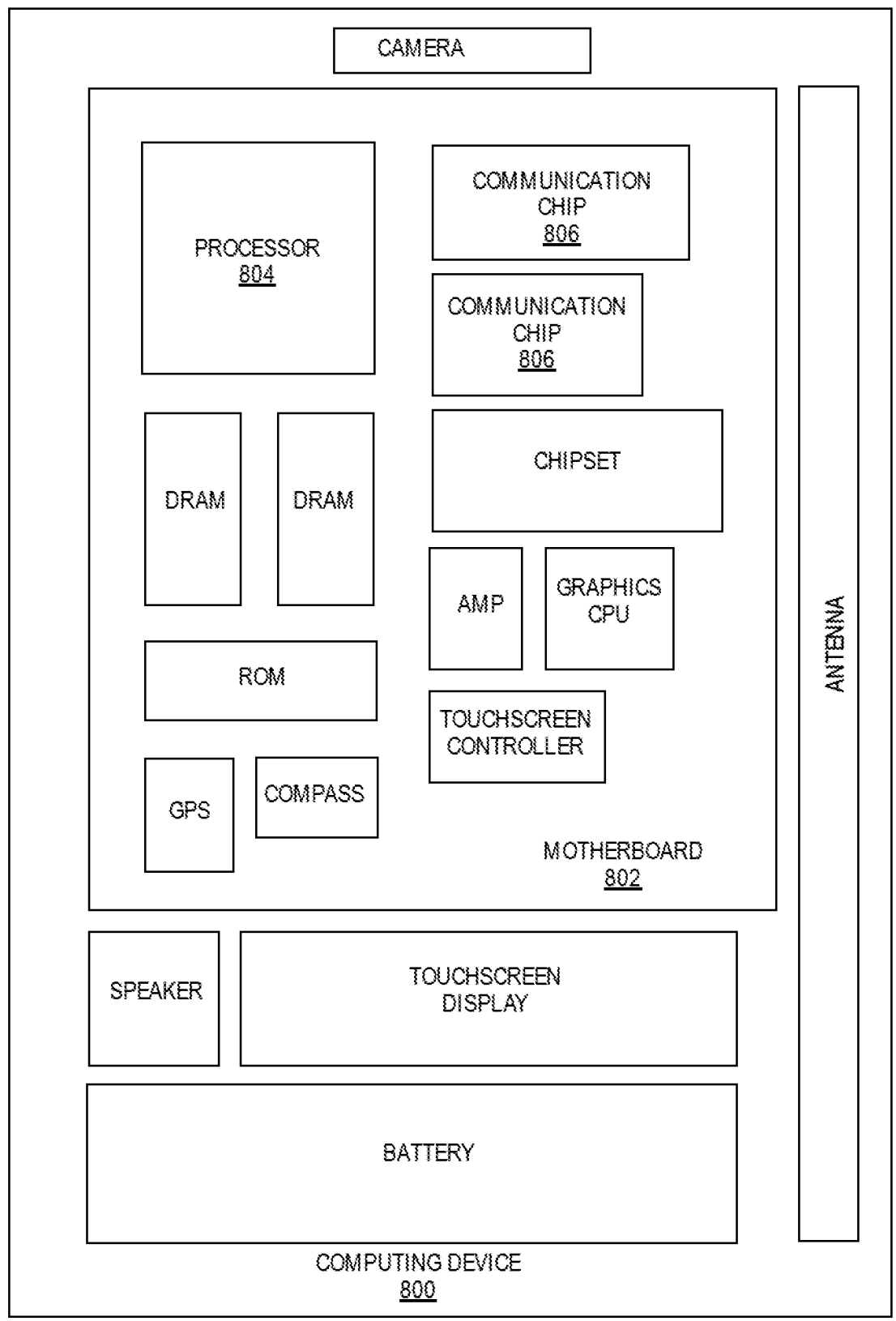
FIG. 8 illustrates a computing device in accordance with one implementation of an embodiment of the disclosure.

FIG. 8 illustrates a computing device 800 in accordance with one implementation of an embodiment of the present disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. The integrated circuit die of the processor 804 may include one or more structures, such as gate endcap isolation structures built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. The integrated circuit die of the communication chip 806 may include one or more structures, such as gate endcap isolation structures built in accordance with implementations of embodiments of the present disclosure.

In further implementations, another component housed within the computing device 800 may contain an integrated circuit die that includes one or structures, such as gate endcap isolation structures built in accordance with implementations of embodiments of the present disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
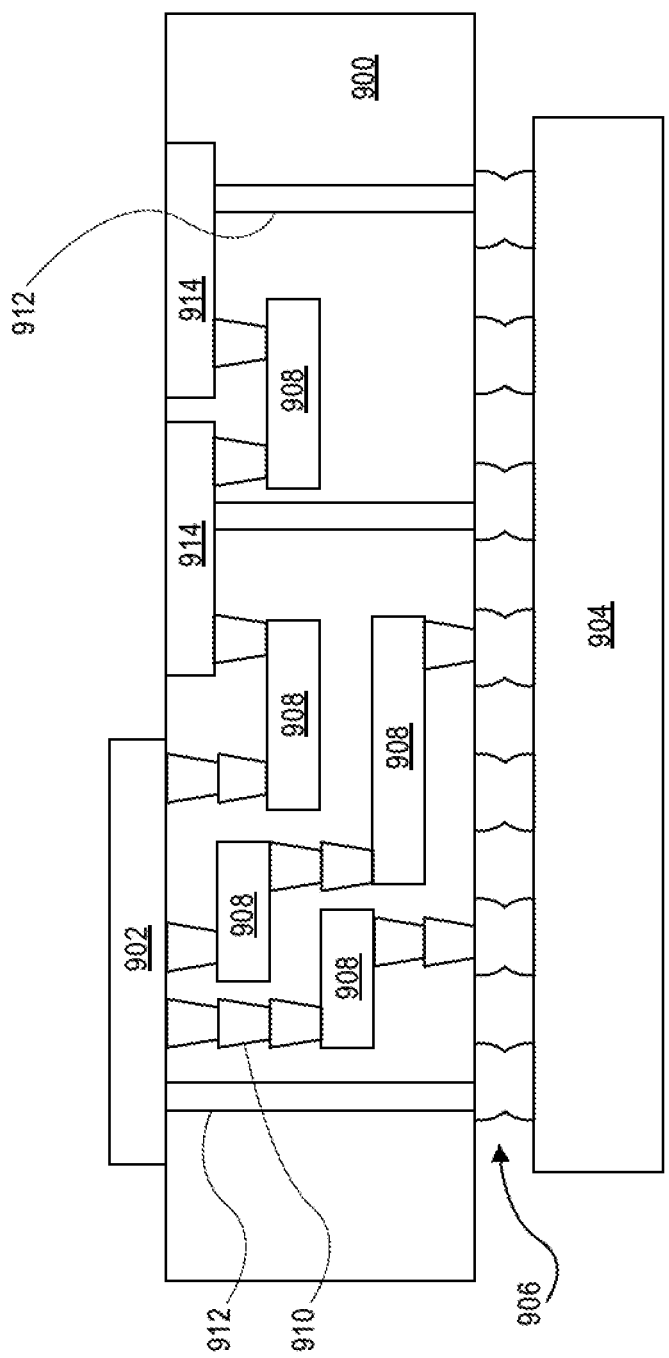
FIG. 9 illustrates an interposer that includes one or more embodiments of the disclosure.

FIG. 9 illustrates an interposer 900 that includes one or more embodiments of the present disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And, in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer 900 may be formed of alternate rigid or flexible materials that may include the same materials described above for use in a semiconductor substrate, such as silicon, germanium, and other group III-V and group IV materials.

The interposer 900 may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the disclosure, apparatuses or processes disclosed herein may be used in the fabrication of interposer 900 or in the fabrication of components included in the interposer 900.

Thus, embodiments of the present disclosure include gate endcap architectures having relatively short vertical stack, and methods of fabricating gate endcap architectures having relatively short vertical stack.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a first semiconductor fin along a first direction. A second semiconductor fin is along the first direction. A trench isolation material is between the first semiconductor fin and the second semiconductor fin. The trench isolation material has an uppermost surface below a top of the first and second semiconductor fins. A gate endcap isolation structure is between the first semiconductor fin and the second semiconductor fin and is along the first direction. The gate endcap isolation structure is on the uppermost surface of the trench isolation material.

Example embodiment 2: The integrated circuit structure of example embodiment 1, further including a first gate structure along a second direction orthogonal to the first direction, the first gate structure over the first semiconductor fin and in contact with a first side of the gate endcap isolation structure. A second gate structure is along the second direction, the second gate structure over the second semiconductor fin and in contact with a second side of the gate endcap isolation structure.

Example embodiment 3: The integrated circuit structure of example embodiment 2, wherein the gate endcap isolation structure extends beyond the first and second gate structures along the first direction.

Example embodiment 4: The integrated circuit structure of example embodiment 2 or 3, further including a first sidewall spacer along sides of the first gate structure, and a second sidewall spacer along sides of the second gate structure. The gate endcap isolation structure is not within the first sidewall spacer or the second sidewall spacer.

Example embodiment 5: The integrated circuit structure of example embodiment 1, 2, 3 or 4, wherein the gate endcap isolation structure has top surface above the top of the first and second semiconductor fins.

Example embodiment 6: The integrated circuit structure of example embodiment 1, 2, 3, 4 or 5, wherein the gate endcap isolation structure includes a lower dielectric portion and a dielectric cap on the lower dielectric portion.

Example embodiment 7: The integrated circuit structure of example embodiment 2, 3 or 4, further including a through fin isolation structure, wherein an end of the second gate structure is in contact with the through fin isolation structure, the end opposite the gate endcap isolation structure along the second direction.

Example embodiment 8: The integrated circuit structure of example embodiment 7, further including a sidewall spacer along sides of the second gate structure, wherein the gate endcap isolation structure is not within the sidewall spacer, and wherein the through fin isolation structure is within the sidewall spacer.

Example embodiment 9: The integrated circuit structure of example embodiment 7 or 8, wherein the through fin isolation structure has a bottom surface below a bottom surface of the gate endcap isolation structure.

Example embodiment 10: An integrated circuit structure includes a semiconductor fin along a first direction. A trench isolation material is adjacent the semiconductor fin. The trench isolation material has an uppermost surface below a top of the semiconductor fin. A gate endcap isolation structure is along the first direction. The gate endcap isolation structure is on the uppermost surface of the trench isolation material. A gate structure is along a second direction orthogonal to the first direction. The gate structure is over the semiconductor fin and is in contact with a side of the gate endcap isolation structure. The integrated circuit structure further includes a through fin isolation structure. An end of the gate structure is in contact with the through fin isolation structure, the end opposite the gate endcap isolation structure along the second direction. A sidewall spacer is along sides of the gate structure. The gate endcap isolation structure is not within the sidewall spacer, and the through fin isolation structure is within the sidewall spacer.

Example embodiment 11: The integrated circuit structure of example embodiment 10, wherein the gate endcap isolation structure extends beyond the gate structure along the first direction.

Example embodiment 12: A computing device includes a board and a component coupled to the board. The component includes an integrated circuit structure. The integrated circuit structure includes a first semiconductor fin along a first direction. A second semiconductor fin is along the first direction. A trench isolation material is between the first semiconductor fin and the second semiconductor fin. The trench isolation material has an uppermost surface below a top of the first and second semiconductor fins. A gate endcap isolation structure is between the first semiconductor fin and the second semiconductor fin and is along the first direction. The gate endcap isolation structure is on the uppermost surface of the trench isolation material.

Example embodiment 13: The computing device of example embodiment 12, further including a memory coupled to the board.

Example embodiment 14: The computing device of example embodiment 12 or 13, further including a communication chip coupled to the board.

Example embodiment 15: The computing device of example embodiment 12, 13 or 14, further including a camera coupled to the board.

Example embodiment 16: The computing device of example embodiment 12, 13, 14 or 15, further including a battery coupled to the board.

Example embodiment 17: The computing device of example embodiment 12, 13, 14, 15 or 16, further including an antenna coupled to the board.

Example embodiment 18: The computing device of example embodiment 12, 13, 14, 15, 16 or 17, wherein the component is a packaged integrated circuit die.

Example embodiment 19: The computing device of example embodiment 12, 13, 14, 15, 16, 17 or 18, wherein the component is selected from the group consisting of a processor, a communications chip, and a digital signal processor.

Example embodiment 20: The computing device of example embodiment 12, 13, 14, 15, 16, 17, 18 or 19, wherein the computing device is selected from the group consisting of a mobile phone, a laptop, a desk top computer, a server, and a set-top box.

What is claimed is:

1. An integrated circuit structure, comprising:
   a first semiconductor fin along a first direction;
   a second semiconductor fin along the first direction;
   a cut fin portion along the first direction;
   a trench isolation material between the first semiconductor fin and the second semiconductor fin and over the cut fin portion, the trench isolation material having an uppermost surface below a top of the first and second semiconductor fins;
   a first gate endcap isolation structure between the first semiconductor fin and the second semiconductor fin and along the first direction, the first gate endcap isolation structure having a bottommost surface above the uppermost surface of the trench isolation material; and
   a second gate endcap isolation structure spaced apart from a side of the second semiconductor fin opposite the first gate endcap isolation structure and along the first direction, the second gate endcap isolation structure having a bottommost surface above the uppermost surface of the trench isolation material, and the second gate endcap isolation structure having a width greater than a width of the first gate endcap isolation structure, wherein the second gate endcap isolation structure is vertically over the cut fin portion.

2. The integrated circuit structure of claim 1, further comprising:
   a first gate structure along a second direction orthogonal to the first direction, the first gate structure over the first semiconductor fin and in contact with a first side of the first gate endcap isolation structure; and
   a second gate structure along the second direction, the second gate structure over the second semiconductor fin and in contact with a second side of the first gate endcap isolation structure.

3. The integrated circuit structure of claim 2, wherein the first gate endcap isolation structure extends beyond the first and second gate structures along the first direction.

4. The integrated circuit structure of claim 3, further comprising:
   a first sidewall spacer along sides of the first gate structure; and
   a second sidewall spacer along sides of the second gate structure, wherein the first gate endcap isolation structure is not within the first sidewall spacer or the second sidewall spacer.

5. The integrated circuit structure of claim 1, wherein the first gate endcap isolation structure has top surface above the top of the first and second semiconductor fins.

6. The integrated circuit structure of claim 1, wherein the first gate endcap isolation structure comprises a lower dielectric portion and a dielectric cap on the lower dielectric portion.

7. A computing device, comprising:
a board; and
a component coupled to the board, the component including an integrated circuit structure, comprising:
- a first semiconductor fin along a first direction;
- a second semiconductor fin along the first direction;
- a cut fin portion along the first direction;
- a trench isolation material between the first semiconductor fin and the second semiconductor fin and over the cut fin portion, the trench isolation material having an uppermost surface below a top of the first and second semiconductor fins;
- a first gate endcap isolation structure between the first semiconductor fin and the second semiconductor fin and along the first direction, the first gate endcap isolation structure having a bottommost surface above the uppermost surface of the trench isolation material; and
a second gate endcap isolation structure spaced apart from a side of the second semiconductor fin opposite the first gate endcap isolation structure and along the first direction, the second gate endcap isolation structure having a bottommost surface above the uppermost surface of the trench isolation material, and the second gate endcap isolation structure having a width greater than a width of the first gate endcap isolation structure, wherein the second gate endcap isolation structure is vertically over the cut fin portion.

8. The computing device of claim 7, further comprising: a memory coupled to the board.

9. The computing device of claim 7, further comprising: a communication chip coupled to the board.

10. The computing device of claim 7, further comprising: a camera coupled to the board.

11. The computing device of claim 7, further comprising: a battery coupled to the board.

12. The computing device of claim 7, further comprising: an antenna coupled to the board.

13. The computing device of claim 7, wherein the component is a packaged integrated circuit die.

14. The computing device of claim 7, wherein the component is selected from the group consisting of a processor, a communications chip, and a digital signal processor.

15. The computing device of claim 7, wherein the computing device is selected from the group consisting of a mobile phone, a laptop, a desk top computer, a server, and a set-top box.

* * * * *